United States Patent
Godlieb et al.

(10) Patent No.: US 10,384,361 B2
(45) Date of Patent: Aug. 20, 2019

(54) PERSONAL CARE DEVICE WITH SLIDING SURFACE

(71) Applicant: KONINKLIJKE PHILIPS N.V., Eindhoven (NL)

(72) Inventors: Robert Godlieb, Eindhoven (NL); Maarten Van den Boogaard, Eindhoven (NL); Jasper Zuidervaart, Eindhoven (NL); Jan Van Dalen, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 231 days.

(21) Appl. No.: 15/306,115

(22) PCT Filed: Apr. 2, 2015

(86) PCT No.: PCT/EP2015/057305
§ 371 (c)(1),
(2) Date: Oct. 24, 2016

(87) PCT Pub. No.: WO2015/161996
PCT Pub. Date: Oct. 29, 2015

(65) Prior Publication Data
US 2017/0050328 A1    Feb. 23, 2017

(30) Foreign Application Priority Data
Apr. 24, 2014   (EP) .................................. 14 165901

(51) Int. Cl.
*B26B 21/60*   (2006.01)
*C23C 14/06*   (2006.01)
(Continued)

(52) U.S. Cl.
CPC .......... *B26B 21/60* (2013.01); *B26B 21/4068* (2013.01); *C23C 14/067* (2013.01);
(Continued)

(58) Field of Classification Search
CPC ... B26B 21/60; B26B 21/4068; C23C 14/067; C23C 14/35; C23C 14/44; B05D 5/08;
(Continued)

(56) References Cited

U.S. PATENT DOCUMENTS

| | | |
|---|---|---|
| 3,754,329 A | 8/1973 | Lane |
| 4,100,309 A | 7/1978 | Micklus |

(Continued)

FOREIGN PATENT DOCUMENTS

| | | |
|---|---|---|
| DE | 2416560 A1 | 10/1975 |
| EP | 0289996 A2 | 11/1988 |
| WO | 2010012879 A1 | 2/2010 |

OTHER PUBLICATIONS 2009 article "BAM: Antiwear and friction-reducing coating" published by "The Society of Tribologists and Lubrication Engineers" (www.stle.org).

*Primary Examiner* — Omar Flores Sanchez

(57) ABSTRACT

The present invention relates to a personal care device having a surface intended to engage the skin and/or hair, such as a blade razor or an electric shaver. The surface of such a device is formed from a substrate on which a hard coating layer is provided. A lubricating layer comprising pendant hydrophilic polymer chains is provided on the hard coating. The hard coating has particles incorporated therein, said particles having covalently attached thereto said pendant hydrophilic polymer chains. In addition, the present invention relates to a process of making a skin engaging surface for such personal care devices.

12 Claims, 1 Drawing Sheet

(51) Int. Cl.
  *B26B 21/40*   (2006.01)
  *C23C 14/35*   (2006.01)
  *C23C 16/44*   (2006.01)
  *B05D 5/08*    (2006.01)

(52) U.S. Cl.
  CPC .............. *C23C 14/35* (2013.01); *C23C 16/44* (2013.01); *B05D 5/08* (2013.01); *B05D 2202/15* (2013.01); *B05D 2350/63* (2013.01); *B05D 2601/20* (2013.01)

(58) Field of Classification Search
  CPC ............ B05D 2202/15; B05D 2350/63; B05D 2601/20
  See application file for complete search history.

(56) References Cited

U.S. PATENT DOCUMENTS

| | | | |
|---|---|---|---|
| 5,005,287 A | 4/1991 | Ritter | |
| 7,966,909 B2 | 6/2011 | Madeira | |
| 2003/0096060 A1 | 5/2003 | Trankiem | |
| 2005/0256528 A1 | 11/2005 | Beavers | |
| 2010/0178515 A1* | 7/2010 | Wang | B26B 21/60 428/421 |
| 2013/0031794 A1 | 2/2013 | Duff, Jr. | |
| 2013/0323291 A1 | 12/2013 | Li | |
| 2015/0047202 A1* | 2/2015 | Rosemberg | B26B 21/405 30/34.05 |
| 2018/0236678 A1* | 8/2018 | Briscoe | B26B 21/227 |

\* cited by examiner

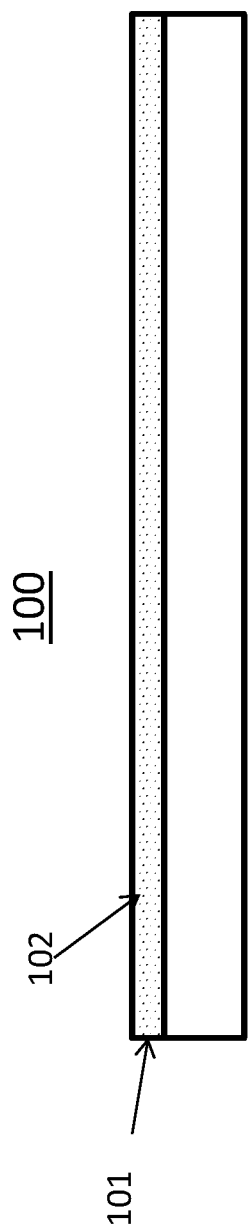

PERSONAL CARE DEVICE WITH SLIDING SURFACE

This application is the U.S. National Phase application under 35 U.S.C. § 371 of International Application No. PCT/EP2015/057305, filed on Apr. 2, 2015, which claims the benefit of International Application No. 14165901.1 filed on Apr. 24, 2014. These applications are hereby incorporated by reference herein.

FIELD OF THE INVENTION

The present invention relates to personal care devices, particularly to personal care devices having at least one surface intended to slidably engage skin and/or hair of a user, i.e. intended to be used in sliding contact with the skin and/or hairs. Preferably, the invention relates to a personal care hair cutting or hair shaving device having at least one hair cutting or hair shaving zone on said at least one surface for slidably engaging skin and/or hair. Examples of such personal care devices are blade razors, especially those having coated razor blade edges, and electric shavers, especially those having coated cutting units or other coated skin engaging surfaces, such as the skin engaging surface of the shaving head of an electric shaver. More specifically the invention relates to personal care devices, such as blade razors and electric shavers, having a coating providing a lubricating effect. In addition, the present invention relates to a process for manufacturing a low-friction surface on such a personal care device.

BACKGROUND OF THE INVENTION

In the process of cutting or shearing a hair during shaving, the friction of the hair against the flanks of the cutting blade is an important aspect. Particularly, the ease of cutting is associated with said friction, and said friction affects the comfort experienced during shaving. Especially in the case of blade shaving, said friction may result in nicks and cuts on the skin. The comfort during shaving is also affected by the friction between the skin and other skin-engaging surfaces of the blade razor or electric shaver.

Therefore, it goes without saying that many attempts were made in the prior art to reduce the friction between skin and/or hair and the surfaces of a personal care device intended for slidably engaging the skin and/or hair of the user, especially but not necessarily in a wet environment, such as in the case of a blade razor. Several friction reducing measures have been proposed.

Reference is for instance made to U.S. patent application publication no. 2003/0096060. Said publication teaches a razor blade including a substrate with a cutting edge defined by a sharpened tip and adjacent facets, a layer of a hard (carbon) coating on the cutting edge, and an overcoat layer of a chromium-containing coating. The overcoat layer is coated with an outer layer of polytetrafluoroethylene (PTFE). Said outer layer is used to provide reduced friction.

Also in U.S. Pat. No. 3,754,329, razor blades are described comprising at least one cutting edge portion defined by two facet portions having a narrow included angle there between. At least a portion of each of the facet portions has an RF sputtered coating of a hard metal and/or a sputtered coating of an organic plastic material. Said organic plastic material is exemplified by polymers being hydrophobic and having low friction characteristics, such as a polytetrafluoroethylene or like fluorine- or chlorine-containing polymers or polyethylene.

Moreover, reference can be made to German "Offenlegungsschrift" 24 16 560, disclosing razor blades having a coating applied thereon to facilitate adhesion to a lubricant. The low friction materials described are hydrophobic materials like polytetrafluoroethylene, polypropylene, polyhexafluoro propylene, polychlorotrifluor ethylene and polyethylene.

Unfortunately, PTFE coatings or, more in general, coatings of other friction-reducing polymers of the types described in the two previous paragraphs, applied in a similar or corresponding way, wear relatively quickly when sliding over the skin under the influence of the mechanical load of hair and skin exerted during shaving. This leads to a reduction in shaving comfort over time.

It is an object of the present invention to provide personal care devices having one or more surfaces intended for slidably engaging the skin and/or hairs of the user, wherein the personal care devices have a prolonged lubricious effect, resulting in prolonged comfort while using the device.

SUMMARY OF THE INVENTION

In a first aspect, the present invention relates to a personal care device having one or more surfaces for slidably engaging skin and/or hair of a user, said one or more surfaces comprising a hard coating, said hard coating having particles incorporated therein, said particles having covalently attached thereto pendant hydrophilic polymer chains. In a preferred embodiment of the present invention, the personal care device is a hair cutting or shaving device having at least one hair cutting or hair shaving zone on said one or more surfaces for slidably engaging skin and or hair of a user.

The hydrophilic polymer chains, contrary to the above mentioned non-hydrophilic polymer chains as discussed in the section "background of the invention", absorb water and expand to form a hydrogel or similar type of structure that has a low friction against hair and skin. Because the hydrophilic polymer chains are pendant and covalently attached through particles incorporated into the hard coating provided on the relevant surface of the personal care device, e.g. to a razor blade surface, a high resistance to wear is achieved during shaving as compared to skin-engaging surfaces where such hydrophilic polymer chains are non-covalently attached directly to the basic substrate of the surface. Thus, the hydrophilic polymer chains form a highly lubricious coating on the personal care device surface, having good adhesion to the surface. A high durability for, e.g., shaving applications is obtained.

In addition, the useful lifetime of the personal care device, especially in case of a blade razor having a coated cutting blade, is prolonged by covalently bonding the pendant hydrophilic polymer chains to particles embedded in a hard coating provided on the substrate of the skin-engaging surface. In the present description and the attached claims, the term "particle" refers to an entity consisting of a compound or composition embedded in a coating layer, wherein the coating layer is of a different material.

That is, the hard coating has incorporated therein particles having active or reactive groups through which the pendant hydrophilic polymer chains are covalently attached. By incorporating these particles, which may also be termed "functionalized particles" because of the active or reactive groups attached to it, into the hard coating, the active groups will be disposed at the outer surface of the hard coating. This enables a strong covalent attachment of the hydrophilic polymer chains to the hard coating, in particular to the particles incorporated in the hard coating. With "particles having active and/or reactive groups" are meant particles which are not inert, but can react with hydrophilic polymer chains or their building units (monomers or oligomers) to form particles having covalently bonded hydrophilic polymer chains attached thereto. This is further elaborated herein-below.

The personal care device according to the invention may be, for example, a blade razor comprising a cutting blade, or an electric shaver comprising a cutting unit, wherein said cutting blade or said cutting unit comprises said hard coating having said particles incorporated therein with the pendant hydrophilic polymer chains covalently attached to said particles in accordance with the present invention. Alternatively, another skin-engaging surface of the blade razor or electric shaver, for example a skin supporting surface arranged adjacent to the cutting blade or cutting unit, may be provided with said hard coating having said particles incorporated therein with the pendant hydrophilic polymer chains covalently attached to said particles in accordance with the present invention.

In a further aspect, the present invention relates to a process of manufacturing a personal care device according to the invention having one or more surfaces for slidably engaging skin and/or hair of a user, in an embodiment a personal care hair cutting or shaving device having at least one hair cutting or hair shaving zone on said one or more surfaces for slidably engaging skin and/or hair, or a process of modifying a skin-engaging surface of a personal care device according to the invention, said process comprising:
(i) providing said surface with a hard coating having incorporated therein particles having active or reactive groups; and
(ii) covalently attaching pendant hydrophilic polymer chains to said active or reactive groups.

These and other aspects of the invention will be apparent from and elucidated with reference to the embodiments described herein-below.

BRIEF DESCRIPTION OF THE DRAWINGS

FIG. 1 is a cross-sectional view of a surface having a coating on the outer surface thereof.

DETAILED DESCRIPTION OF EMBODIMENTS

As said hereinabove, in a first aspect, the present invention relates to a personal care device having one or more surfaces for slidably engaging the skin and/or hair of the user, such as the surface of a razor blade or hair-cutting blade, this latter term being used as a synonym of "razor blade", wherein said one or more surfaces comprise a hard coating, said hard coating having covalently attached to it pendant hydrophilic polymer chains.

FIG. 1 shows a surface 100 having a hard coating 101 applied by a physical vapour deposition technique, a sputtering technique, or a chemical vapour deposition technique. The hard coating 101 is modified to include particles 102 incorporated therein.

Particularly, the personal care device of the present invention, comprising said hard coating, has incorporated in said hard coating particles having active and/or reactive groups through which the pendant hydrophilic polymer chains are covalently attached to the hard coating.

Generally, personal care devices having one or more surfaces for slidably engaging the skin and/or hair of the user are typically formed of a suitable substrate material, such as stainless steel, metal or other metal alloy, ceramic, composites, plastic, glass, or combinations thereof. Most often, stainless steel is used as a substrate of razor blades. As noted, in the personal care devices of the invention these substrates are coated with a hard coating.

Nowadays, surfaces or substrates of a device intended to be used in sliding contact with the skin are often, if not always, covered with a hard coating layer, being applied directly on the substrate or on an interlayer. Such a hard coating layer may provide improved strength, corrosion resistance and/or improved shaving efficiency. It can be made from carbon containing materials such as diamond, amorphous diamond or diamond-like carbon, nitrides, carbides, oxides or other ceramic materials. Suitable materials are described in US-2003/0096060 mentioned here before, and the principle is also described in US-A-2013/0031794 to which reference will be made herein below. In accordance with the present invention, use is made of such hard coatings that prolong the lifetime of the razor blade or, in general, of the skin engaging surface of the personal care device, said coatings being selected from those having a low friction with skin and hair such as e.g. diamond-like carbon (DLC).

The interlayer facilitates the bonding of the hard coating layer to the substrate material. Suitable interlayers are e.g. niobium- or chromium-containing materials.

Also in accordance with the present invention, the hard coating may be applied directly to the substrate or indirectly through use of one or more interlayers.

Hydrophilic polymer chains useful in the present invention are polymer chains based on monomers having polar or charged functional groups, rendering the polymer soluble in water.

Suitable hydrophilic polymers are capable of absorbing water and expanding to form a hydrogel. Examples of such polymers are polysaccharides, cellulose derivatives, poly(meth)acrylic acid polymers and copolymers, polyethylene glycol and polypropylene glycols. Other suitable polymers are homo- or copolymers based on acrylamide, maleic anhydride, etc. A very favourable polymer is polyvinylpyrrolidone (PVP).

Such coatings based on e.g. polyvinylpyrrolidone (PVP), when not covalently bonded to particles incorporated in a hard coating provided on the skin-engaging surface of the personal care device, such as the razor blade surface, in accordance with the present invention, have the drawback that they are very weakly attached to the surface by entanglement of the polymer chains directly on the substrate surface. This causes rapid wear of such coatings during shaving and makes them less suitable, when applied on a razor blade, than e.g. PTFE, as taught in US-2003/0096060-A1 cited here before. More in general, a drawback of a hydrophilic polymer coating is that, when applied in a conventional way by entanglement of the polymer chains directly on the substrate surface, the coating is weakly attached to the surface of the device. This causes rapid wear, not only of the lubricating layer, but also of the surface of the device, e.g. the razor blade, per se.

The hydrophilic coatings as applied in accordance with the present invention are more resistant to wear during, for instance, shaving by being chemically bonded to the surface intended for a sliding contact with the skin instead of merely being physically bonded. As a result, the polymer chains of the hydrophilic coating in accordance with the invention have a covalent bond with the particles incorporated in the hard coating provided on the substrate. This is most ideally achieved by grafting onto the particles present in the hard coating or, alternatively, by bonding the polymer (or oligomer) to active groups of the particles present in the hard coating.

In a preferred embodiment, the personal care device is a blade razor comprising a razor blade having a sharpened substrate coated with a hard coating, and having pendant hydrophilic polymer chains covalently attached to particles incorporated in the hard coating.

Razor blades typically include a sharpened substrate, often made of stainless steel, but also other suitable materials and alloys can be used as material for the substrate. The razor blades or hair-cutting blades of a personal care device according to the present invention can be part of dry and wet shavers, either electrically driven or manually operated.

It would in principle be possible to have the hydrophilic polymer chains covalently and pendantly attached to the sharpened substrate material of a shaver. However, since stainless steel as used for shaving applications has a limited ability to form such covalent bonds, hard coating layer materials are proposed in accordance with the present invention as an intermediate layer between the substrate and the hydrophilic polymer layer. In particular, hard coatings can be easily modified to enable covalent bonding of hydrophilic polymer chains that can form a hydrogel with good adhesion and durability for shaving.

Particularly, in accordance with the present invention, the surface of the personal care device intended for slidably engaging the skin and/or hair of the user is provided with a hard coating modified by incorporating therein particles having active and/or reactive groups.

Such active and/or reactive groups should provide the attachment or bonding of the hydrophilic polymer chains to the hard coating, and should be present in a number that allows the formation of an effective hydrophilic polymer coating on the relevant surface of the personal care device.

In a particular embodiment, the density of the particles increases towards the outer surface of said hard coating. This embodiment preserves the function of the conventional hard coating and maximizes the covalent bonding or grafting ability for the hydrophilic polymer layer.

A desirable method would be to incorporate ceramic particles having active groups at their surfaces into the material of the hard coating.

As indicated, it is easy to apply a hard coating layer to the substrate of the relevant skin engaging surface and to include a material, e.g. a polymer or ceramic with active groups, into this hard coating layer during the application process. In this material, at the surface of the material particles, a large number of active groups is present. By distributing this material into the hard coating layer, the active groups will be disposed at the outer surface of the hard coating layer. These active groups are used to achieve strong covalent bonding of the hydrophilic polymer chains, which are subsequently applied on the hard coating layer.

Moreover, including particles in the substrate material, in particular steel, would detract from the essential properties of steel. In addition, a hard coating is a relevant and useful addition to a razor blade. Furthermore, by virtue of the embodiment wherein the hard coating is provided with a density gradient of the particles towards the outer surface of the hard coating, said covalent bonding does not materially detract from or negate the function of the hard coating.

In the process of manufacturing a personal care device according to the invention, the active and/or reactive groups are provided by the introduction of particles comprising said active and/or reactive groups into the hard coating provided on the relevant skin-engaging surface of the device. Suitable active and/or reactive groups are, for instance, selected from the group consisting of hydroxyl groups, acid groups, amine groups, amide groups, and mixtures thereof.

These functional active groups may form part of particles that are introduced into the hard coating layer. Examples of such particles are silica particles or metallic particles such as alumina or other metal particles having an oxide layer that is suitable for covalent bonding. In addition, polymer particles may be used, that is, polymer particles having active groups suitable to react with groups of the hydrophilic polymers. Examples of such functional polymer particles are nylons and polyoxides.

In the manufacturing process of the present invention, the step of covalently attaching the hydrophilic polymer chains to said active groups may for example be effected by grafting the polymer chains to said active groups, or may for example be effected by coupling oligomers or polymers to said active groups.

Consequently, in accordance with the present invention, a material, e.g. polymer particles with active groups or ceramic or metallic parts, which does not necessarily have a low friction of itself, but which can be strongly contained in the hard coating layer provided on the relevant surface of the personal care device, and which has an active and/or reactive group or active and/or reactive groups exposed to the atmosphere, is incorporated into a hard coating provided on said surface.

Preferably, the compounds and/or particles containing the active or reactive groups are introduced when the hard coating is applied to the substrate that forms the basis of the skin-engaging surface of the personal care device. The hard coating is generally applied by known techniques such as physical vapour deposition (PVD), (magnetron or rf) sputtering, or chemical vapour deposition (CVD). In a preferred embodiment, the particles or compositions comprising the active and/or reactive groups are incorporated within the hard coating layer according to a concentration gradient, wherein the gradient is preferably formed such that the concentration of active and/or reactive groups increases in a direction towards an outer surface of the hard coating intended to be in contact with the skin.

Subsequently, a hydrophilic polymer layer can be realized by, for example, covalently bonding pre-polymerized polymer chains onto the particles present near the surface of the hard coating. In another embodiment, the polymer chains can be grown (grafted) from the individual monomers present near the surface of the hard coating. This can be achieved e.g. by grafting an amide to create an extremely hydrophilic polyamide coating.

Independent of the way in which the covalently bonded hydrophilic polymer layer is prepared, it is possible to further react, e.g. cross-link or colour, the hydrophilic polymer layer based on the properties needed. In a preferred embodiment, the hydrophilic polymer chains are cross-linked to further decrease the wear of the hydrophilic coating.

The covalently bonded hydrophilic coating can have both decorative and, more importantly, functional properties. In a suitable embodiment, the covalently bonded layer consists of hydrophilic polymers that act as a lubricious layer, whilst being more resistant to wear than a conventionally applied hydrophilic coating.

The hydrophilic polymer layer can be realized by covalently bonding pre-polymerized polymer chains onto the particles incorporated in the hard coating layer. In another embodiment, the polymer chains are grown (grafted) from the monomers present on the surface of the hard coating layer. In a preferred embodiment, the covalently bonded layer consists of hydrophilic polymers that act as a lubricious layer, which is more resistant to wear than a conventionally applied hydrophilic coating.

A specific hard coating, suitable for shaving devices and enabling such inclusion of a polymer, is the low-friction aluminum magnesium boride (BAM) coating. The following description is, however, equally applicable to the application of other hard coating materials, as well. An example of the BAM coating is described in detail in U.S. application 2013/0031794. Incidentally, it is known that in such a coating a low-friction polymer (e.g. PTFE) can be included and that the concentration and distribution of such included polymer can be varied during the application process of the coating using PVD and/or CVD. Low-friction hydrogel forming hydrophilic polymers are however less suitable for inclusion during BAM deposition and are unlikely to survive the deposition processes used.

In an embodiment of the present invention, during the application of the BAM layer a polymer or particles having active groups can be incorporated into the BAM layer. By including such active group-carrying materials in the BAM layer, these active groups can be used to create or comprise a durable hydrophilic coating on top of the BAM layer provided on the skin-engaging surface of, e.g., a razor blade or a shaving head.

Subsequently, hydrophilic polymer chains are applied to the surface of the BAM layer, which contains the active groups, by reacting these polymer chains with the active groups of the included particles, compounds or compositions. The type of reaction will depend on the type of polymer chains and the type of active groups, but can for example be an esterification or etherification or the creation of an amide function.

In an intermediate step, the polymer included in the BAM may be activated further by plasma or corona or ozone treatment, as is widely published in the domain of coatings.

The above embodiment, as said, has been described in some detail for a BAM layer. In alternative embodiments, the hard coating layer may however also be made of other materials, such as based on a composite DLC (diamond like carbon) coating, or on an electrolytic, electroless or a fully grown Ni coating. That is, in both latter alternatives it is possible to include materials in the hard coating as well.

Independent of the type of hard coating layer and the type of material or particles incorporated in the hard coating, it is preferred that the material or particles are distributed with a gradient in the hard coating layer. This gradient preferably provides an increase in the number of particles in a direction towards the outside surface of the hard coating. This arrangement is optimal to enable the presence of a higher concentration of active groups on the outside surface of the hard coating, and to optimize the hard coating layer itself at locations closer to the substrate.

The present invention will now be further illustrated while referring to the following non-limiting examples based on razor blades comprising a hard coating of aluminium magnesium boride (BAM).

EXAMPLE 1

A conventional stainless steel substrate of a razor blade of a blade razor is coated with a BAM layer using magnetron sputtering as described in U.S. 2013/0031794, with the modification that during this coating process silica particles are added in an increasing concentration.

A BAM coated razor blade is obtained, with silica particles being incorporated in the BAM coating in an increasing concentration in the direction towards the outer surface of the BAM coating.

EXAMPLE 2

In a suitable vessel the surface of a coated razor blade, prepared in accordance with Example 1, is activated using a corona treatment. The activated surface, and especially the silica particles present at the activated surface, is contacted with an oxygen-free deionised water solution containing 7 wt. % acrylamide and 1.5 wt. % nitric acid. This solution has a temperature of 45° C.

Subsequently, under a nitrogen stream, ammonium cerium nitrate is added to a total concentration of 0.18 wt. % to catalyse a grafting reaction.

If the colour of ammonium cerium nitrate is no longer detected, the razor blade is removed and washed with deionised water.

It is placed in a 1M solution of sodium hydroxide in deionised water of 40° C. to convert the polymerized polyacrylamide to the acid salt.

EXAMPLE 3

A razor blade is activated using the method as described in Example 2.

The activated surface is now placed in a solution containing 5 wt. % pre-polymerized polyacrylamide, which solution has a temperature of 80° C.

After a dwell time of 15 minutes, the razor blade is washed with deionized water and placed in a 1M solution of sodium hydroxide in deionized water of 40° C. to convert the covalently linked polyacrylamide to its acid salt.

The invention is not limited to the disclosed embodiments. These embodiments are to be seen as examples of many alternatives. "Comprising", when used in the present description, does not exclude other elements or steps. The terms "a" and "an" do not exclude a plurality, and may hence mean "at least one" or "one or more".

Where in the present description and in the claims reference is made to percentages, these percentages are weight percentages drawn to the weight of the total composition, unless otherwise indicated.

Features recited in separate claims or described herein in specific separate embodiments may be advantageously combined.

The invention claimed is:

1. A personal care device having one or more surfaces for slidably engaging skin and/or hair of a user, said one or more surfaces comprising a hard coating applied by a physical vapour deposition technique, a sputtering technique, or a chemical vapour deposition technique, said hard coating being modified by having particles incorporated therein, said particles having covalently attached thereto pendant hydrophilic polymer chains, wherein a density of said particles increases toward an outer surface of said hard coating.

2. The personal care device according to claim 1, being a personal care hair cutting or shaving device having at least one hair cutting or hair shaving zone on said one or more surfaces.

3. The personal care device according to claim 1, wherein the pendant hydrophilic polymer chains are covalently attached to said particles through bonding or grafting.

4. The personal care device according to claim 1, wherein said hard coating is applied directly or indirectly on said one or more surfaces.

5. The personal care device according to claim 1, wherein an overcoat layer is applied directly or indirectly on said hard coating.

6. The personal care device according to claim 1, wherein the personal care device is a blade razor comprising a cutting blade, or an electric shaver comprising a cutting unit, and wherein said cutting blade, said cutting unit or another skin engaging surface of the blade razor or electric shaver comprises said hard coating having said particles incorporated therein with the pendant hydrophilic polymer chains covalently attached to said particles.

7. The personal care device according to claim 1, wherein the pendant hydrophilic polymer chains are cross-linked.

8. A process of manufacturing a personal care device having one or more surfaces for slidably engaging skin and/or hair of a user or of modifying a skin-engaging surface of a personal care device according to any one of the preceding claims, said process comprising:

(i) providing said surface with a hard coating by a physical vapour deposition technique, a sputtering technique, or a chemical vapour deposition technique, and modifying said hard coating by incorporating therein particles having active or reactive groups; and (ii) covalently attaching pendant hydrophilic polymer chains to said active or reactive groups.

9. The process according to claim 8, wherein the particles are introduced in said hard coating such that a density of said particles increases towards an outer surface of said hard coating.

10. The process according to claim 8, wherein the active or reactive groups are selected from the group consisting of hydroxyl groups, acid groups, amine groups, amide groups, and mixtures thereof.

11. The process according to claim 8, wherein step (ii) is effected by grafting polymer chains to said active or reactive groups.

12. The process according to claim 8, wherein step (ii) is effected by coupling oligomers or polymers to said active or reactive groups.

* * * * *